United States Patent [19]
Chiu

[11] Patent Number: 5,358,905
[45] Date of Patent: Oct. 25, 1994

[54] SEMICONDUCTOR DEVICE HAVING DIE PAD LOCKING TO SUBSTANTIALLY REDUCE PACKAGE CRACKING

[75] Inventor: Anthony M. Chiu, Richardson, Tex.

[73] Assignee: Texas Instruments Incorporated, Dallas, Tex.

[21] Appl. No.: 42,026

[22] Filed: Apr. 2, 1993

[51] Int. Cl.$^5$ .............................................. H01L 21/60
[52] U.S. Cl. ................................... 437/209; 437/211; 437/214; 437/217; 437/220
[58] Field of Search ............... 257/701, 727, 702, 704, 257/710, 726, 666, 676; 437/209, 211, 214, 217, 220, 215

[56] References Cited

U.S. PATENT DOCUMENTS

| | | | |
|---|---|---|---|
| 3,762,039 | 10/1973 | Douglass et al. | 437/220 |
| 3,902,189 | 8/1975 | Simpson | 437/220 |
| 4,177,480 | 12/1979 | Hiatzmann et al. | 437/217 |
| 4,258,381 | 3/1981 | Inaba | 437/220 |
| 4,298,883 | 1/1981 | Komatsu et al. | 437/217 |
| 4,761,518 | 8/1988 | Butt et al. | 437/217 |
| 5,096,853 | 3/1992 | Yasunaga et al. | 437/217 |
| 5,150,193 | 9/1992 | Yasuhara et al. | 257/676 |
| 5,202,288 | 4/1993 | Doering et al. | 437/217 |

FOREIGN PATENT DOCUMENTS

| | | | |
|---|---|---|---|
| 0258098 | 3/1988 | European Pat. Off. | 437/217 |
| 53-66172 | 6/1978 | Japan | 437/217 |
| 61-241958 | 10/1986 | Japan | 257/676 |
| 61-276245 | 12/1986 | Japan | 257/676 |
| 63-252455 | 10/1988 | Japan | 257/676 |
| 2130864 | 5/1990 | Japan | 257/676 |
| 397253 | 4/1991 | Japan | 257/676 |

*Primary Examiner*—Tom Thomas
*Assistant Examiner*—Kevin M. Picardat
*Attorney, Agent, or Firm*—Ronald O. Neerings; James C. Kesterson; Richard L. Donaldson

[57] ABSTRACT

A semiconductor device package (10) comprises plastic encapsulation (20) around a die pad (14) and a semiconductor chip (12). The semiconductor chip (12) is electrically interconnected to lead fingers (18) by conductive wires (16). The die pad (14) has at least one ear or tab (26) extending outward from die pad (14). In one embodiment of the invention, at least one hole (34) is formed through each ear or tab (26). In another embodiment of the invention, each ear or tab (26) is bent or curved away from the horizontal plane of the die pad. In yet another embodiment of the invention, at least one hole (34) is formed through each ear or tab (26) and ear or tab (26) is bent or curved away from the horizontal plane of the die pad (14). Ear or tab (26), having at least one hole (34), bent or curved away from the horizontal plane of the die pad (14), or having at least one hole (34) and bent or curved away from the horizontal plane of the die pad (14) helps prevent cracks from occurring in the plastic encapsulation (20) due to differences in the thermal expansion rates of the die pad (14) and the plastic encapsulation (20).

20 Claims, 3 Drawing Sheets

SEMICONDUCTOR DEVICE HAVING DIE PAD LOCKING TO SUBSTANTIALLY REDUCE PACKAGE CRACKING

FIELD OF THE INVENTION

The present invention relates to the field of semiconductor devices and, more particularly, to packaged semiconductor devices having a die pad interlocked with an encapsulating mold compound.

BACKGROUND OF THE INVENTION

Conventional surface mounted semiconductor chip packages are manufactured for assembly on printed wiring boards which are installed into electronic controllers such as computers. Such packages comprise a semiconductor chip mounted on a die pad, wired to lead fingers and encapsulated in plastic. These packages are then soldered or otherwise connected into the printed wiring board in predetermined configurations.

The presence of cracks in an integrated circuit IC package substantially increases the probability that moisture or other contaminants will penetrate the package, reach the surface of the semiconductor die and eventually cause the device to fail. The major cause of IC package cracking is moisture related stress that causes a thermal mismatch between the silicon Si of the semiconductor device, the die pad, or lead frame adjacent the silicon device and the encapsulating plastic mold compound.

Thermal stresses tend to induce delamination of, or cracks in, the plastic encapsulation due to differences in the thermal expansion rates of the plastic encapsulation material and the material from which the die pad is made. A die pad typically expands in all directions slower than the plastic encapsulation and thus tends to pull the plastic encapsulation apart at the weakest points, i.e., the small peripheral edge around the die pad.

Thermal mismatch stress is at its lowest point during package molding where temperatures in the range of 185° C. are encountered. After molding, the package is cooled to room temperature. The plastic will contract more than the silicon chip and lead frame which are stacked together before molding. This difference in contraction puts the interface between the pad and plastic under high stress, resulting in separation and delamination. When there is separation between plastic and mount pad, moisture from the atmosphere eventually fills the space created by the separation. During vapor phase reflow the packages are placed into position on the board which is then subjected to heat from a chemical vapor which reflows all the solder thereon at 215° and above. This high temperature causes the moisture to turn into vapor which exerts a huge pressure inside the package, which can cause the package to blow up.

The packages are also subjected to internal and external thermal stresses throughout their normal operating life which may increase the percentage of delamination of, or cracks in, the plastic encapsulation. Internal thermal stresses are caused by the heat generated internally by the packaged semiconductor device when it is operating. This problem is destined to become more acute as advances in large scale integration produce integrated circuits with ever diminishing geometries, increasing densities and a resulting increase in the amount of heat generated by the semiconductor die per square unit of area. External thermal stresses are caused by the heat generated by operation of the electronic system in which the packages are installed.

One technique to prevent cracks involves incorporating mechanical locks into molded plastic packaged devices to help secure a die pad to the plastic mold compound. Such mechanical locks typically include a continuous rib formed around the periphery of the die pad that extends into the surrounding plastic mold compound. Unfortunately, it has been discovered that as the industry moves toward very thin packaged devices, conventional techniques for mechanically interlocking a die pad and plastic mold compound are insufficient to prevent cracking or chipping of the plastic around the periphery of the die pad.

Other techniques involve roughening up the backside of the die pad or use of a coating on the die pad to increase the adhesion between the mold compound and the mount pad or heat spreader.

Yet another technique utilizes pockets or concave dimples on the bottom of the die pad opposite the semiconductor chip in an attempt to increase the contact area between the plastic encapsulation material and the die pad material. It is more expensive to etch dimples than to use a cost efficient die pad manufacturing technique such as stamping, and while somewhat effective, dimples do not resolve the cracking problem. The dimples provide a greater area for contact between the bottom of the die pad and the plastic encapsulation which only helps keep the bottom of the die pad in position relative to the encapsulation in contact therewith. Unfortunately, the position of the bottom of the die pad relative to the encapsulation in contact therewith has a minimal effect on cracks or delamination caused by differences in thermal expansion rates which tend to force the encapsulation apart, and therefore, cracks still occur.

Still yet another technique involves forming holes in a die pad directly under the semiconductor die. Since the holes are only under the semiconductor die, the net result is the same as the pockets or dimples as previously discussed.

SUMMARY OF THE INVENTION

The present invention disclosed herein comprises a method and apparatus for improving the strength of a die pad encapsulated semiconductor package which substantially eliminates or reduces problems associated with prior die pad encapsulated semiconductor packages. An improved die pad having at least one ear or tab extending away from the die pad is utilized.

In one embodiment of the invention, at least one hole is formed through the at least one ear or tab. The hole provides for improved anchorage between the plastic encapsulation surrounding the die pad and the semiconductor die by allowing encapsulation material to flow inside and through the hole(s).

In another embodiment of the invention, at least one ear or tab is bent or curved away from the horizontal plane of the die pad. In yet another embodiment of the invention at least one hole is formed through at least one ear or tab and the ear or tab is bent or curved away from the horizontal plane of the die pad. The ear or tab, bent or curved away from the horizontal plane of the die pad, or having at least one hole and bent or curved away from the horizontal plane of the die pad, helps prevent cracks from occurring in the plastic encapsulation due to differences in the thermal expansion rates of the die pad and the plastic encapsulation.

It is a technical advantage of the present invention that it provides for an improved distribution of thermally induced stresses and thus helps prevent failure of the package due to cracks in the encapsulation.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Figure 1:
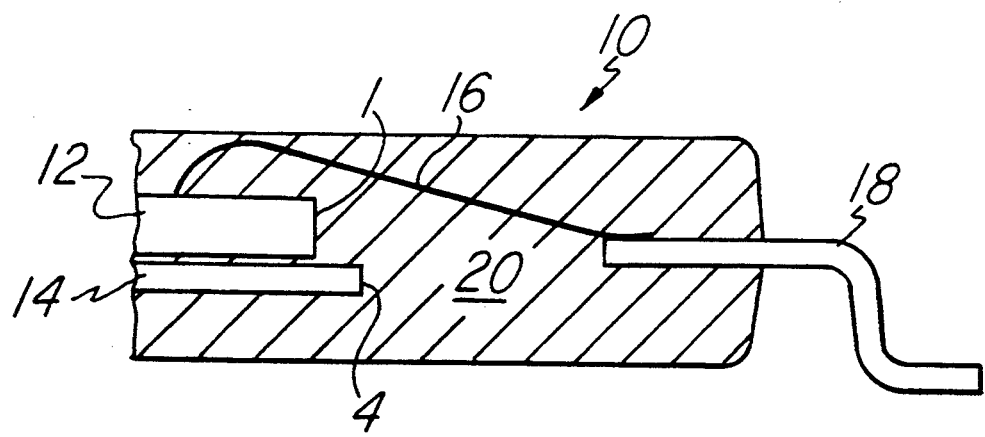
FIG. 1 is an elevation view in partial cross-section of a packaged semiconductor device showing the relative positions of a semiconductor device, die pad, lead finger and plastic package during the high temperatures of the molding portion of the assembly process.
Figure 2:
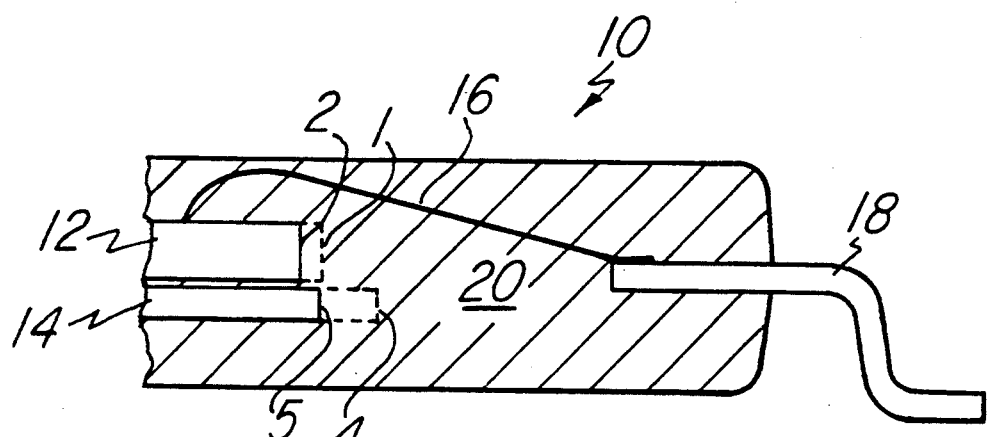
FIG. 2 is the partial cross-section of a packaged semiconductor device of FIG. 1 showing the relative positions of the semiconductor device, die pad, lead finger and plastic package after the packaged device has cooled to room temperature.

In FIGS. 1-6, like items are identified by like and corresponding numerals for ease of reference. FIG. 1 is an elevation view in partial cross-section of a packaged semiconductor device. Packaged semiconductor device 10 includes a semiconductor device 12, a die pad 14, at least one bond wire 16, at least one lead finger 18 that extends into a lead pin and a molded package 20. The molding process subjects all of the elements to high temperatures, e.g., 185° C. for example. The high temperatures cause semiconductor device 12 and die pad 14 to expand and extend horizontally to positions 1 and 4, respectively, at the time the plastic is molded into package 20 20, as shown in FIG. 2, (1 & 4 are at the same location when pad size = die size).

Figure 3:
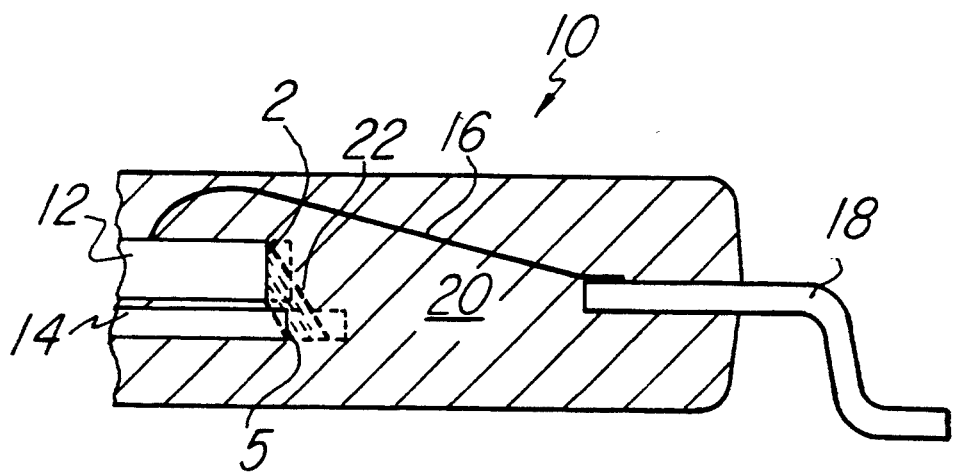
FIG. 3 is the partial cross-section of a packaged semiconductor device of FIGS. 1 and 2 showing void remaining after the packaged semiconductor device has cooled to room temperature.

As the packaged device cools to room temperature, semiconductor device 12 contracts horizontally to position 2 and die pad 14 contracts to position 5. Unfortunately, the mold compound cannot move in complete unison with the contraction of semiconductor device 12 and die pad 14. The result is a void which occurs in the shaded region 22, as shown in FIG. 3. The void in region 22 is filled by air or moisture and will likely cause the package to crack during vapor phase reflow. This problem is more fully explained in A. Nishimura, S. Kawai, "Effect of Lead Frame Material on Plastic-Encapsulated IC package Cracking Under Temperature Cycling," IEEE 0569-5503, 1989, pp. 524-530.

Figure 4:
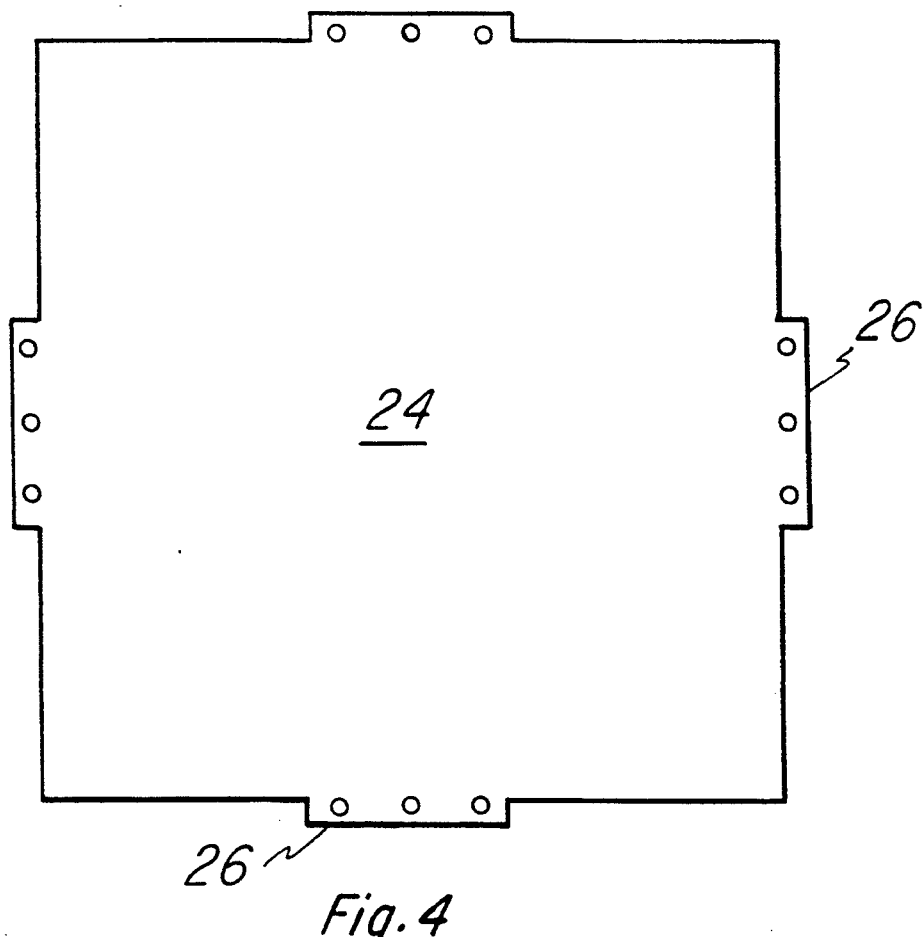
FIG. 4 is a plan view of a die pad according to one embodiment of the present invention.

FIG. 4 shows a die pad 24 having ears or pads 26 that extend outwardly from the periphery of the die pad which, when incorporated into a packaged semiconductor device according to a preferred embodiment of the invention, substantially reduces or eliminates package cracking. Ears or pads 26 are located in a region where the lead tips are fanning out and thus will not affect the location of the leadtips.

Figure 5:
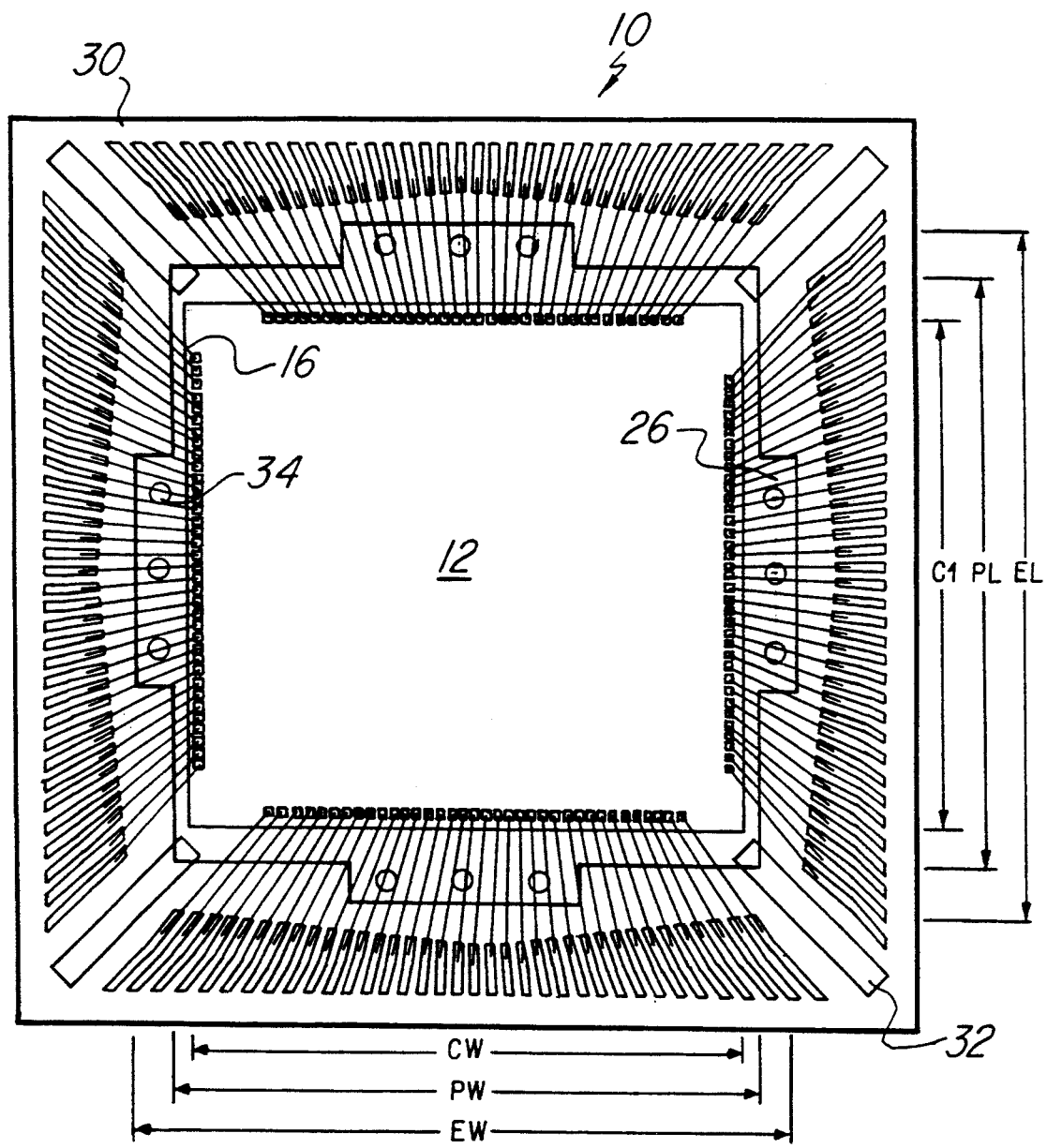
FIG. 5 is a plan view of a portion of one embodiment of the present invention.

Referring to FIG. 5, the chip package 10 is shown in plan view prior to encapsulation. The chip package 10 comprises a lead frame 28 of the type having a die pad 24, lead fingers 18 and continuous bar 30. The die pad 24 is connected to lead frame 28 by support bars 32 which extend from the four corners of the continuous bar 30.

The lead frame 28 may comprise any appropriate material such as a steel/nickel alloy and may be constructed by any appropriate method. The preferred method of construction is stamping due to its low cost and high efficiency. For the sake of clarity of illustration, lead frame 28 is shown as a single piece, whereas in actuality, lead frame 28 would be but one of an interconnected strip of stamped lead frames.

A semiconductor chip 12 is centered on and fixed to the die pad 24 by any appropriate method, for example, with epoxy. The chip 12 is prefabricated with circuitry, not shown, which is interconnected to the lead fingers 18. Interconnection is by any appropriate method, for example, thermal sonic bonding of conductive wires 16 which may be, for example, gold.

The chip 12 has a length cl and a width cw. Ears or tabs 26 extend outwardly from the square or rectangular periphery of die pad 24. The die pad 24 has a length EL slightly larger than the length cl and a width EW larger than width cw. The length PI can be smaller, equal or larger than the length cl and the width PW can be smaller, equal or larger than the width cw. An important aspect of the present invention comprises a plurality of holes 34 formed through ears or tabs 26. Holes 34 may be formed by any appropriate method such as drilling, stamping or etching. As an example, if ears or tabs 26 extend outwardly 15 mils from the square or rectangular periphery of die pad 24, holes 34 should be formed from 6 to 12 mils in diameter. Lead frame 28 and its interconnected chip 12 are then placed in a transfer mold, not shown. Plastic encapsulation 20 is injected under pressure into the mold to completely encapsulate and form package 10. Continuous bar 30 and the portions of support bars 32 protruding from the sides of package 10 are removed by any appropriate method, for example, trimming.

Holes 34 in the ears or tabs 26 of die pad 24 allow plastic encapsulation 20 to flow through ears or tabs 26. Plastic within holes 34 helps secure die pad 24 to the plastic, reinforcing plastic encapsulation 20 and lessening the effect of expansion rate differences.

Figure 6:
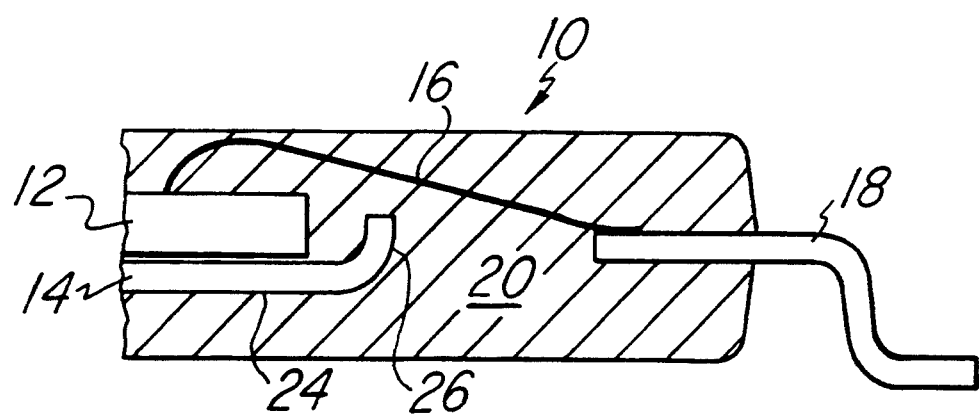
FIG. 6 is an elevation view in partial cross-section of a packaged semiconductor device showing the relative positions of a semiconductor device, die pad, lead finger and plastic package according to another embodiment of the invention.

In another embodiment of the invention, shown in FIG. 6, ears or tabs 26 are bent or curved away from the main axis of die pad 24. And while FIG. 6 shows a bend or curvature of about 90 degrees, any curvature is preferable to no curvature, with 90 degrees being optimum. While it is preferred that ears or tabs 26 include holes 34 in this embodiment of the invention, bent or curved ears or tabs will also secure die pad 24 to plastic package 20, even without holes 34.

While this invention has been described with reference to illustrative embodiments, this description is not to be construed in a limiting sense. Various modifications to the illustrative embodiments, as well as other embodiments of the invention will be apparent to persons skilled in the art upon reference to this description. It is therefore contemplated that the appended claims will cover any such modification or embodiments as fall within the true scope of the invention.

What is claimed is:

1. A method for making an improved semiconductor chip package, comprising the steps of:
   forming a die pad having at least one ear or tab extending outward from said die pad, said at least one ear or tab having at least one hole passing therethrough;
   fixing a semiconductor chip to said die pad at a location spaced from said at least one hole;
   electrically interconnecting lead fingers to said chip; and
   sealing said die pad, said chip and said lead fingers with a packaging material, said packaging material extending around and through said at least one hole of said at least one ear or tab.

2. The method of claim 1, in which said at least one ear or tab is bent away from the horizontal plane of said die pad.

3. The method of claim 1, in which said die pad is a rectangle having a top surface, a bottom surface and four side surfaces.

4. The method of claim 3, in which said rectangle is a square.

5. The method of claim 3, in which an ear or tab extends outward from each of said four side surfaces, each ear or tab having at least one hole passing therethrough.

6. The method of claim 3, in which one and only one ear or tab extends outward from each of said four side surfaces, each ear or tab having at least one hole passing therethrough.

7. The method of claim 5, in which said ear or tabs extend along the same plane as said die pad.

8. The method of claim 6, in which said ear or tabs extend along the same plane as said die pad.

9. The method of claim 8, in which each ear or tab has three holes passing therethrough.

10. The method of claim 6, in which each ear or tab is centered along the side surface from which it extends.

11. The method of claim 1, in which said die pad is formed along a horizontal plane and said at least one ear or tab extends outward from said die pad and away from said horizontal plane.

12. The method of claim 5, in which at least one of said ears or tabs extends away from the plane of said die pad.

13. The method of claim 1, in which said semiconductor chip has a length smaller than the length of said die pad and a width smaller than the width of said die pad.

14. The method of claim 1, in which said die pad is metal.

15. The method of claim 1, in which said die pad is a heat spreader.

16. The method of claim 1, in which said package material is plastic.

17. The method of claim 1, in which said semiconductor chip is attached to said die pad.

18. A method for making a die pad, comprising the steps of:
   forming a die pad having a top surface, a bottom surface and four side surfaces, an ear or tab extending outward from each of said side surfaces; and
   forming at least one hole or void in each of said four side surfaces.

19. A method for making a lead frame, comprising the steps of:
   forming a continuous frame having a hole or void therein;
   forming a die pad having a top surface, a bottom surface and four side surfaces, an ear or tab extending outward from each of said side surfaces, each ear or tab having at least one hole passing therethrough;
   placing said die pad within said hole or void of said continuous frame; and
   attaching said die pad to said continuous frame.

20. The method of claim 19, wherein said die pad is attached to said continuous frame with four support bars.